United States Patent [19]
Tamaki et al.

[11] Patent Number: 4,582,562
[45] Date of Patent: Apr. 15, 1986

[54] PROCESS FOR PREPARING A SINGLE OXIDE CRYSTAL

[75] Inventors: Takahiko Tamaki; Kuniro Tsushima, both of Tokyo, Japan

[73] Assignee: Nippon Hoso Kyokai, Tokyo, Japan

[21] Appl. No.: 585,213

[22] Filed: Mar. 1, 1984

[30] Foreign Application Priority Data

Mar. 10, 1983 [JP] Japan ............................ 58-38211

[51] Int. Cl.$^4$ ............................................. C30B 9/13
[52] U.S. Cl. ............................. 156/624; 156/DIG. 63
[58] Field of Search .............. 156/617 R, 617 SP, 622, 156/624, DIG. 63, DIG. 71, DIG. 74, DIG. 79, DIG. 86; 423/263, 594; 252/62.57

[56] References Cited

U.S. PATENT DOCUMENTS 3,677,718 7/1972 Lawless .
4,077,832 3/1978 Robertson et al. ................ 156/624
4,092,208 5/1978 Brice et al. ................... 156/617 SP

FOREIGN PATENT DOCUMENTS 2418711 10/1974 Fed. Rep. of Germany .

OTHER PUBLICATIONS

H. Takeuchi et al., "Faraday Rotation and Optical Absorption ...", 1973, 4789-4790, J. Appl. Phys., vol. 44, No. 10.
H. Takeuchi, "The Faraday Effect of Bismuth Substituted ...", 1975, 1903-1910, J. Journal of Applied Physics, vol. 14, No. 12.

*Primary Examiner*—Hiram H. Bernstein
*Attorney, Agent, or Firm*—Spencer & Frank

[57] ABSTRACT

A process for preparing a single oxide crystal comprising the steps of mixing to fuse raw materials for crystal growth and a flux, cooling the fused mixture slowly to grow and precipitate a single crystal, and dipping up said single crystal from the molten flux while said flux is molten. A substitution amount of the substituted element in the grown crystal can be controlled. The crystal thus obtained is of high quality with little cracks.

11 Claims, 5 Drawing Figures

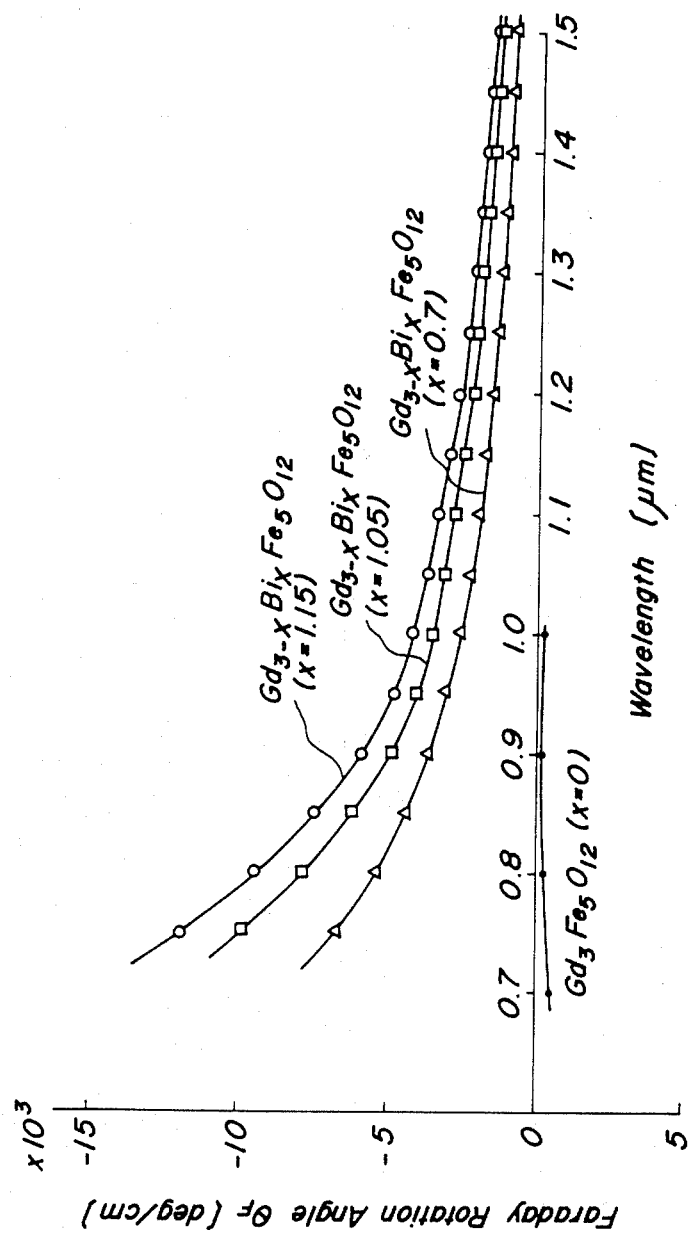
FIG_4

PROCESS FOR PREPARING A SINGLE OXIDE CRYSTAL

BACKGROUND OF THE INVENTION

1. Field of the Invention

The present invention relates to a process for preparing a single oxide crystal, and particularly to an improved process employing the flux method for growing a single oxide crystal of high quality.

2. Description of the Prior Art

The flux method comprises the steps of dissolving raw materials, from which a single crystal is to be grown, in an adequate flux to prepare a high temperature saturated solution, and cooling the solution slowly to precipitate and grow a single crystal. The flux method can advantageously be applied to a very wide variety of raw materials, and enables a high melting point single crystal to be grown at a temperature far lower than the melting point thereof. In addition, growth of the single crystal can be done using a simple furnace according to this method. Therefore, the flux method has been used for the growth of many kinds of single crystals.

Generally, in the flux method, the step of extracting a grown single crystal from the fluid or solidified flux is required after the completion of the crystallization. The extracting methods conventionally employed include:

(1) a method of picking up a single crystal by crushing the solidified flux with a hammer, (2) a method of extracting a single crystal by dissolving away the flux with a solvent suitable for the flux used, such as hot hydrochloric or nitric acid or hot water, and (3) a method of extracting a single crystal from the flux by overflowing it by slanting a crucible before the solidification of the flux.

Here, it is necessary to select such a material as flux that only a sufficient amount of raw materials is dissolved at a high temperature and that a solid solution of the flux with the raw materials is not formed in the solid phase. In addition, it is also required to select such a flux as to be used at such a temperature and in such an atmosphere as to allow the raw materials to remain stable.

Examples of the fluxes conventionally used for the growth of single oxide crystals include PbO, PbO-PbF$_2$, B$_2$O$_3$, Bi$_2$O$_3$ and KF, which were empirically found to be suitable for such a flux. Of those flux materials, Bi$_2$O$_3$, PbO or the like is shrunk and hardened upon solidification. When a flux of such properties is used, a grown single crystal receives such a pressure applied thereto upon solidification of the flux that the single crystal is disadvantageously subject to the development of cracks in the case of the above-mentioned method (1) or (2). Further, the above-mentioned method (3) is seldom employed, because it involves such demerits that the overflown flux adheres to the furnace material and dissolves the furnace material, and that expensive raw materials are disposed every time after the production of a single crystal.

On the other hand, in order to grow a single crystal of bismuth-substituted gadolinium-iron garnet, it has been reported that Bi$_2$O$_3$ is used as flux (see "Faraday Rotation and Optical Absorption of a Single Crystal of Bismuth-Substituted Gadolinium Iron Garnet" by H. Takeuchi, S. Ito, I. Mikami and S. Taniguchi, J. Appl. Phys., Vol. 44, No. 10 (1973), pp. 4789–4790). In this paper the, conditions of growing such a single crystal have not being clearly disclosed. If such a single crystal is grown by the usual flux method, a grown single crystal receives a pressure from the solidified flux and is subject to the development of cracks, as mentioned above. The crystal having bismuth uniformly substituted therein could be obtained.

SUMMARY OF THE INVENTION

It is, therefore, an object of the present invention to provide an improved process employing the flux method for preparing a grown single oxide crystal of high quality in which the above-mentioned disadvantages are eliminated.

In order to achieve this object, a grown single crystal is extracted from the flux in the molten state, according to the improved process of the present invention.

More specifically, in accordance with the present invention, there is provided a process for preparing a single crystal comprising the steps of mixing and fusing a mixture of raw materials for crystal growth and a flux, cooling the fused mixture slowly to grow and precipitate a single crystal, and extracting the grown single crystal from the molten flux.

Here, it is preferable that the single crystal is dipped up from; i.e., scooped out of the molten flux.

Preferably, the single crystal is of bismuth-substituted gadolinium-iron garnet derived from a mixture of 8 mol% or less, exclusive of 0 mol%, of Gd$_2$O$_3$, 30 to 53 mol% of Fe$_2$O$_3$, and 40 to 61 mol% of Bi$_2$O$_3$.

More preferably, the single crystal is of bismuth-substituted gadolinium-iron garnet derived from a mixture of Gd$_2$O$_3$ in the range of 5–7 mol%, Fe$_2$O$_3$ in the range of 39–44 mol% and Bi$_2$O$_3$ in the range of 50–56 mol%.

The above-described mixture may further include B$_2$O$_3$ in such an amount as to satisfy the formula: $0 < \text{B}_2\text{O}_3$ amount (mol)/Bi$_2$O$_3$ amount (mol) $\leq 0.084$, more preferably $0 < \text{B}_2\text{O}_3$ amount (mol)/Bi$_2$O$_3$ amount (mol) $\leq 0.08$.

It is preferable that the single crystal is dipped up at a temperature ranging from 1,050° C. to the solidification temperature of the fused mixture.

BRIEF DESCRIPTION OF THE DRAWINGS

The present invention will be illustrated in more detail by examples regarding preparation of single crystals of bismuth-substituted gadolinium-iron garnets with reference to the accompanying drawings, in which:

FIG. 4 is a chart of characteristic curves illustrating the wave length dependency of the Faraday rotation angle ($\theta_F$) for each one of Gd$_{3-x}$Bi$_x$Fe$_5$O$_{12}$ crystals and a Gd$_3$Fe$_5$O$_{12}$ crystal.

DETAILED DESCRIPTION OF THE PREFERRED EMBODIMENTS

Figure 1:
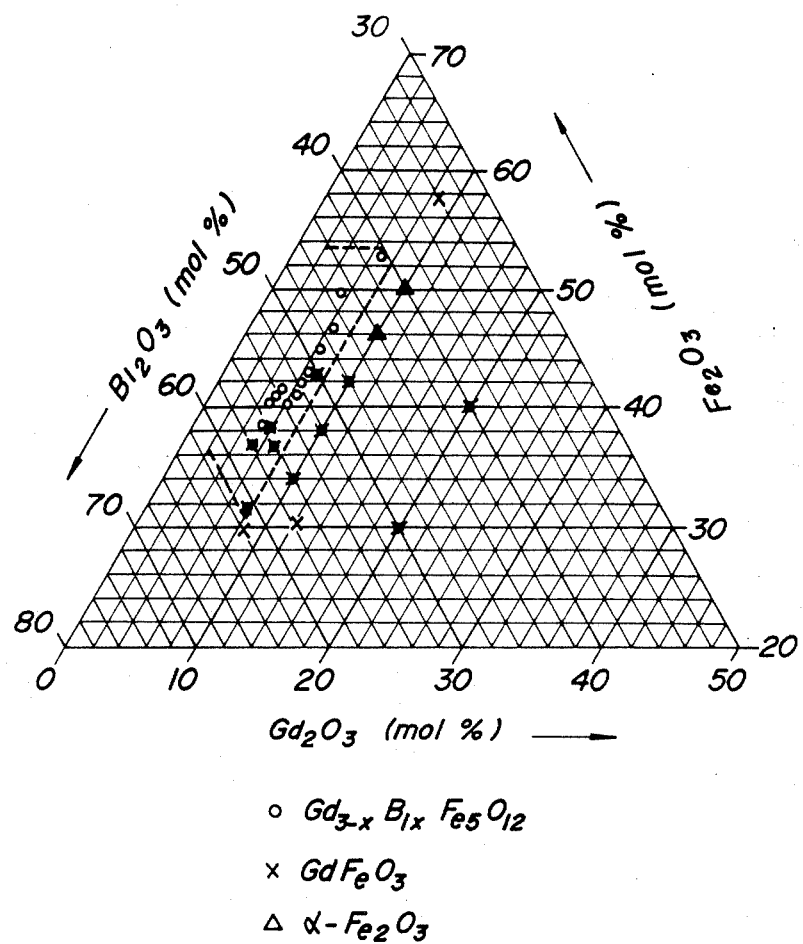
FIG. 1 is a composition diagram demonstrating a mixing ratio of Gd$_2$O$_3$/Fe$_2$O$_3$/Bi$_2$O$_3$ allowing the growth of a single crystal of gadolinium-iron garnet.

Bismuth-substituted gadolinium-iron garnets (Gd$_{3-x}$Bi$_x$Fe$_5$O$_{12}$) show a considerably large Faraday effect, so that they are under investigations for possible use thereof as isolator materials for optical communication or magneto-optic heads for reading out information recorded in magnetic recording medium.

In order to grow a bismuth-containing magnetic garnet crystal showing a large Faraday effect by means of the flux method, a mixture of bismuth oxide with lead oxide, lead fluoride or the like has conventionally been used as the flux. Where a lead-containing flux is used, lead is likely to be incorporated into a crystal. As a result, the Faraday rotation angle ($\theta_F$) of the crystal becomes larger. However, the absorption coefficient ($\alpha$) also becomes larger. As a result, there is a disadvantage in that a large figure of merit ($\theta_F/\alpha$) is not obtained.

A flux of $Bi_2O_3$ alone is seldom used for the growth of a garnet single crystal, since a hole is likely to be opened in a platinum crucible by a reaction thereof with the flux at a high temperature in a reducing atmosphere.

Examples will now be given, but the following examples should not be construed as limiting the scope of the present invention.

EXAMPLES 1–39

$Bi_2O_3$ alone, or a mixture of $Bi_2O_3$ and $B_2O_3$ were used as the flux in examples 1–39.

Optimum conditions were obtained as to the mixing ratio of raw materials and flux, the mixing ratio of $Gd_2O_3$ and $Fe_2O_3$ as the raw materials, the highest temperature to melt and keep a mixture, a slow cooling rate, the lowest temperature in the slow cooling and the like. The results were as shown in Tables 1, 2, 3, 4 and 5. In the Remarks of the Tables, values of $$R = \frac{B_2O_3(mol)}{Bi_2O_3(mol)} \times 100$$

and values of Faraday rotation angle ($\theta_F$) at a wave length of 0.8 μm are indicated.

TABLE 1

Single Crystals of $Gd_{3-x}Bi_xFe_5O_{12}$
Prepared by Slow Flux-Cooling Method

| Example | $Gd_2O_3$(g) (mol %) | $Fe_2O_3$(g) (mol %) | $Bi_2O_3$(g) (mol %) | $B_2O_3$(g) | Highest Temperature (°C.) | Lowest Temperature in Slow Cooling (°C.) | Slow Cooling Rate (°C./h) | Grown Crystal O/G * | Remarks |
|---|---|---|---|---|---|---|---|---|---|
| 1 | 4.87 (12.1) | 5.36 (30.1) | 30 (57.8) | | 1280 | 785 | 1.1 | O | |
| 2 | 4.27 (8.5) | 6.58 (29.7) | 40 (61.8) | | 1280 | 785 | 1.1 | O | |
| 3 | 4.06 (7.0) | 13.42 (52.6) | 30 (40.3) | | 1285 | 758 | 5.8 | G | |
| 4 | 4.06 (6.2) | 13.42 (46.4) | 40 (47.4) | | 1285 | 758 | 5.8 | G | |
| 5 | 8.12 (5.8) | 30.41 (49.5) | 80 (44.7) | | 1273 | 800 | 2.2 | G | |
| 6 | 8.12 (6.2) | 26.84 (46.4) | 80 (47.4) | | 1273 | 800 | 2.2 | G | |
| 7 | 8.12 (6.6) | 23.26 (42.9) | 80 (50.5) | | 1273 | 800 | 2.2 | G | $\theta_F = 5000$ |
| 8 | 8.12 (6.8) | 21.46 (40.9) | 80 (52.3) | | 1273 | 800 | 2.2 | G | |
| 9 | 8.12 (7.3) | 17.88 (36.6) | 80 (56.1) | | 1273 | 800 | 2.2 | G & O | | note
O: Orthoferrite,
G: Garnet

TABLE 2

Single Crystals of $Gd_{3-x}Bi_xFe_5O_{12}$
Prepared by Slow Flux-Cooling Method

| Example | $Gd_2O_3$(g) (mol %) | $Fe_2O_3$(g) (mol %) | $Bi_2O_3$(g) (mol %) | $B_2O_3$(g) | Highest Temperature (°C.) | Lowest Temperature in Slow Cooling (°C.) | Slow Cooling Rate (°C./h) | Grown Crystal O/G * | Remarks |
|---|---|---|---|---|---|---|---|---|---|
| 10 | 8.12 (7.9) | 14.31 (31.6) | 80 (60.5) | | 1273 | 800 | 2.2 | G & O | |
| 11 | 8.12 (6.2) | 26.84 (46.4) | 80 (47.4) | | 1310 | 760 | 3.2 | G | |
| 12 | 8.12 (6.6) | 23.26 (42.9) | 80 (50.5) | | 1310 | 760 | 3.2 | G | |
| 13 | 6.09 (5.3) | 20.13 (40.1) | 80 (54.6) | | 1310 | 760 | 3.2 | G | |
| 14 | 8.12 (6.8) | 21.46 (40.9) | 80 (52.2) | | 1310 | 760 | 3.2 | G | |
| 15 | 6.09 (5.5) | 18.78 (38.4) | 80 (56.1) | | 1310 | 760 | 3.2 | G | |
| 16 | 6.09 (5.6) | 17.45 (36.7) | 80 (57.7) | | 1310 | 760 | 3.2 | G & O | |
| 17 | 16.24 (7.5) | 40.56 (42.4) | 140 (51.1) | | 1315 | 970 | 7.5 | G & O | |

TABLE 2-continued

Single Crystals of $Gd_{3-x}Bi_xFe_5O_{12}$
Prepared by Slow Flux-Cooling Method

| Example | $Gd_2O_3$(g) (mol %) | $Fe_2O_3$(g) (mol %) | $Bi_2O_3$(g) (mol %) | $B_2O_3$(g) | Highest Temperature (°C.) | Lowest Temperature in Slow Cooling (°C.) | Slow Cooling Rate (°C./h) | Grown Crystal O / G * | Remarks |
|---|---|---|---|---|---|---|---|---|---|
| 18 | 8.12 (5.9) | 23.26 (38.1) | 100 (56.1) | | 1315 | 870 | 7.5 | G & O | | note
O: Orthoferrite,
G: Garnet

TABLE 3

Single Crystals of $Gd_{3-x}Bi_xFe_5O_{12}$
Prepared by Slow Flux-Cooling Method

| Example | $Gd_2O_3$(g) (mol %) | $Fe_2O_3$(g) (mol %) | $Bi_2O_3$(g) (mol %) | $B_2O_3$(g) | Highest Temperature (°C.) | Lowest Temperature in Slow Cooling (°C.) | Slow Cooling Rate (°C./h) | Grown Crystal O / G * | Remarks |
|---|---|---|---|---|---|---|---|---|---|
| 19 | 16.24 (7.5) | 40.5 (42.3) | 140 (50.2) | | 1305 | 970 | 7.5 | G & O | |
| 20 | 8.12 (6.2) | 23.25 (40.3) | 90 (53.5) | | 1290 | 840 | 0.9 | G | |
| 21 | 8.12 (4.6) | 25.1 (44.7) | 80 (48.9) | | 1255 | 850 | 0.6 | G | $\theta_F = 7200$ |
| 22 | 8.12 (8.8) | 23.25 (57.4) | 40 (33.8) | | 1160 | 840 | 1 | O | |
| 23 | 8.12 (6.6) | 23.26 (30.1) | 80 (35.3) | 10 (29.7) | 1255 | 850 | 0.6 | O | R = 84 |
| 24 | 8.12 (4.5) | 25.1 (31.8) | 80 (34.7) | 10 (29.0) | 1255 | 850 | 0.6 | O | R = 84 |
| 25 | 8.12 (4.4) | 26.84 (33.7) | 80 (34.0) | 10 (28.4) | 1255 | 850 | 0.6 | O | R = 84 |
| 26 | 8.12 (6.1) | 23.25 (39.5) | 80 (46.6) | 2 (7.8) | 1150 | 910 | 0.42 | O | R = 17 |
| 27 | 8.12 (6.3) | 23.25 (41.1) | 80 (48.5) | 1 (4.1) | 1160 | 840 | 1 | G & O | R = 8.4 | note
O: Orthoferrite,
G: Garnet

TABLE 4

Single Crystals of $Gd_{3-x}Bi_xFe_5O_{12}$
Prepared by Slow Flux-Cooling Method

| Example | $Gd_2O_3$(g) (mol %) | $Fe_2O_3$(g) (mol %) | $Bi_2O_3$(g) (mol %) | $B_2O_3$(g) | Highest Temperature (°C.) | Lowest Temperature in Slow Cooling (°C.) | Slow Cooling Rate (°C./h) | Grown Crystal O / G * | Remarks |
|---|---|---|---|---|---|---|---|---|---|
| 28 | 3.62 (10) | 5.43 (34) | 20.09 (56) | | 1310 | 950 | 1.4 | G & O | |
| 29 | 3.62 (10) | 6.07 (38) | 24.2 (52) | | 1310 | 950 | 1.4 | G & O | |
| 30 | 3.62 (10) | 6.71 (42) | 22.37 (48) | | 1310 | 950 | 1.4 | G & α | |
| 31 | 3.62 (10) | 7.35 (46) | 20.5 (44) | | 1310 | 950 | 1.4 | G & α | |
| 32 | 3.62 (10) | 7.99 (50) | 18.64 (40) | | 1310 | 950 | 1.4 | G & α | |
| 33 | 7.25 (20) | 4.79 (30) | 23.3 (50) | | 1310 | 950 | 1.4 | G & O | |
| 34 | 7.25 (20) | 6.39 (40) | 18.64 (40) | | 1310 | 950 | 1.4 | G & O | | note
α: $\alpha$-$Fe_2O_3$

TABLE 5

Single Crystals of $Gd_{3-x}Bi_xFe_5O_{12}$ Prepared by Slow Flux-Cooling Method

| Example | $Gd_2O_3$(g) (mol %) | $Fe_2O_3$(g) (mol %) | $Bi_2O_3$(g) (mol %) | $B_2O_3$(g) | Highest Temperature (°C.) | Lowest Temperature in Slow Cooling (°C.) | Slow Cooling Rate (°C./h) | Grown Crystal O/G | Remarks |
|---|---|---|---|---|---|---|---|---|---|
| 35 | 13.8 (6.6) | 39.53 (42.9) | 136 (50.5) | | 1195 | dipped up at 1,015° C. | 12 | G & O | |
| 36 | 34.1 (6.5) | 17.66 (41.9) | 350.7 (51.6) | | 1200 | dipped up at 1,000° C. | 2 | G | $\theta_F = 8000$ |
| 37 | 34.1 (6.45) | 97.66 (41.91) | 350.7 (51.57) | 0.08 (0.08) | 1310 | dipped up at 978° C. | 0.4 | G | $\theta_F = 8800$  R = 0.1 |
| 38 | 17.05 (6.44) | 48.83 (41.88) | 175.36 (51.53) | 0.08 (0.15) | 1300 | dipped up at 972° C. | 0.6 | G | $\theta_F = 9500$  R = 0.3 |
| 39 | 41.0 (6.45) | 117.4 (41.90) | 421.69 (51.58) | 0.1 (0.08) | 1300 | dipped up at 980° C. | 0.6 | G | R = 0.2 | note
O: Orthoferrite,
G: Garnet

As shown in the Tables, when $Bi_2O_3$ alone was used as the flux ($Bi_2O_3$ also serves as a component of the raw materials) (see Examples 1-22, 28-26), a stoichiometric $Gd_2O_3/Fe_2O_3$ ratio of 3/5 in mols for garnet cannot provide garnet single crystal but a single crystal of gadolinium orthoferrite ($GdFeO_3$). The residual matter remaining after the removal of the single crystal was subjected to analysis by an X-ray diffractometer. It was found that almost all of the residual matter is composed of $BiFeO_3$ and $Bi_2O_3$, and the rest of that contains small amounts of $Gd_2O_3$ and $Bi_2Fe_4O_9$.

These experimental results indicate that $BiFeO_3$, which is an undesired product, may be formed at a high temperature before the growth of a single crystal of garnet, whereby $Fe_2O_3$, which is necessary for the growth of a desired single crystal of $Gd_3Fe_5O_{12}$, may become insufficient in amount, thus leading to the growth of $GdFeO_3$. With an increase in amount of $Fe_2O_3$ for compensating the insufficiency of $Fe_2O_3$, a single crystal of bismuth-substituted gadolinium-iron garnet was grown together with a single crystal of gadolinium orthoferrite in a single crucible (Examples 9, 10 and 16 to 19). With a further increase in amount of $Fe_2O_3$ to provide a $Gd_2O_3/Fe_2O_3/Bi_2O_3$ molar ratio of 6.6/42.9/50.5, only a single crystal of garnet of 5 to 6 cubic mm in size was grown (Example 12). Even if the amount of $Fe_2O_3$ was further increased, however, a grown single garnet crystal was obtained with a tendency of a smaller size of the crystal.

FIG. 1 illustrates a composition diagram demonstrating a mixing ratio of $Gd_2O_3/Fe_2O_3/Bi_2O_3$ allowing the growth of a single crystal of gadolinium-iron garnet. In FIG. 1, the symbol O indicates the growth of a garnet single crystal alone ("G" in the Tables), the symbol ⊠ the growth of both a single garnet crystal and an orthoferrite crystal ("G & O" in the Tables), the symbol the growth of both a single crystal of garnet and α-$Fe_2O_3$ ("G and α" in Table 4), and the symbol X the growth of an orthoferrite crystal alone ("O" in the Tables). Further, it is a matter of course that a single crystal of the garnet type is not grown when the amount of gadolinium is zero. As is apparent from FIG. 1, it is preferable that the mixing ratio of raw materials for allowing the growth of a garnet single crystal is substantially in the range of 8 mol% or less (exclusive of 0 mol%) for $Gd_2O_3$, 30 to 53 mol% for $Fe_2O_3$ and 40 to 61 mol% for $Bi_2O_3$.

In Examples 7, 8, 12-14, 20, 23, 26, 27 and 35-39, a single crystal having a large size was obtained. Thus, it is preferable that 5 (mol%)$\leq Gd_2O_3 \leq$7 (mol%), 39 (mol%)$\leq Fe_2O_3 \leq$44 (mol%) and 50 (mol%)$\leq Bi_2O_3 \leq$56 (mol%).

$Bi_2O_3$ and $B_2O_3$ were used as the flux in Examples 23-27 and Examples 37-39 mentioned in Tables 3 and 5. With a small amount of $B_2O_3$, a garnet single crystal alone was grown (Examples 37-39). With an increase in an amount of $B_2O_3$ to 1 g as against 80 g of $Bi_2O_3$, both a single garnet crystal and a single orthoferrite crystal were grown (Example 27). With a further increase in an amount of $B_2O_3$ to 10 g or 2 g as against 80 g of $Bi_2O_3$ (see Examples 23-26), an orthoferrite crystal alone was grown despite the composition of the components other than $B_2O_3$, where it is expected that a single garnet crystal alone is grown. The addition of $B_2O_3$ to $Bi_2O_3$ as an additive component of the flux lowered the solidification temperature of the flux by about 20° to 50°.

Examples 27 and 37-39 show that it is preferable that a ratio of $B_2O_3$ amount (mol) to $Bi_2O_3$ amount (mol) is larger than zero and equal to or less than 0.084, and more preferably equal to or less than 0.08.

As described before, the use of $Bi_2O_3$, PbO or the like as the flux frequently results in the formation of a number of cracks in the inside of a grown single crystal because of the pressure imposed thereon by the solidified flux unlike in a case where $PbF_2$, $B_2O_3$ or the like is used.

In order to avoid the formation of such cracks in Examples 35-39 in Table 5 of the present invention, a grown single crystal alone was extracted, for example, dipped up or scooped out of the molten flux by using a platinum net or plate before solidification of the flux in the course of slow flux-cooling. In this case, a single crystal of high quality having few cracks was obtained.

In the method of the present invention, a size and a bismuth-substitution amount (x) of a single crystal can be measured at any temperature as it slowly cools down.

Figure 2:
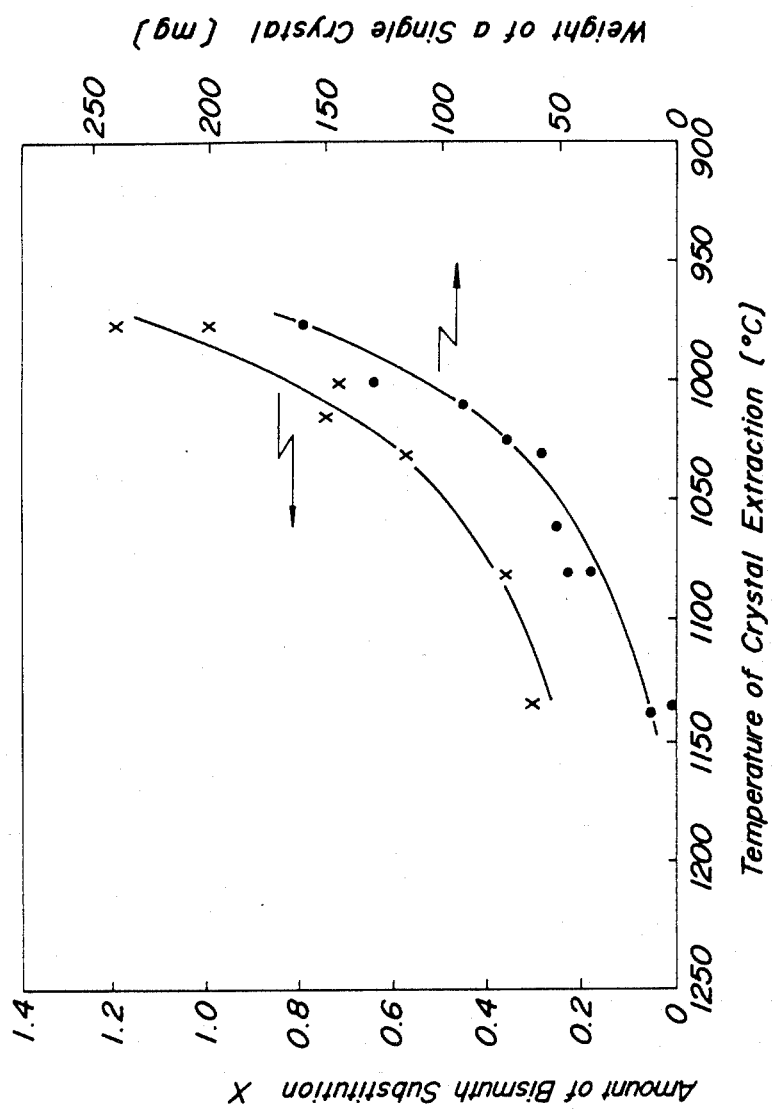
FIG. 2 is a chart of characteristic curves illustrating respective relationships between the temperature of dipping up a single crystal and the substitution amount of bismuth, and between that dipping up temperature and the weight of the single crystal.

FIG. 2 demonstrates the temperature dependence of bismuth substitution amount and weight of a single crystal. The chart in FIG. 2 was drawn by using the data when dipping up the crystal at various temperatures in the case that the $Gd_2O_3/Fe_2O_3/Bi_2O_3$ molar ratio is 6.6/42.9/50.5 (Example 35). As is apparent from FIG. 2, the size and the bismuth substitution amount of the single crystal increase non-linearly as the dipping up temperature is lowered. A single crystal of about 50 to 50 mg in weight was obtained, from which the single crystal was polished to provide a cube of 2 to 3×2 to 3 mm in size. In order to obtain a larger cube than the above-mentioned one, it is necessary that a single crystal is extracted by dipping it up after the fused solution is slowly cooled down 1050° C. or less. A single crystal dipped up from the fused solution having a temperature of 980° C. had the weight of 160 mg and a bismuth substitution amount (x) was about 1.15.

In general, as the temperature of the used solution lowers, the viscosity of the used solution increases to make it difficult to dip up therefrom the grown single crystal. When $Bi_2O_3$ alone is used as the flux, the lowest temperature allowing the crystal to be dipped up is about 1,000° C. in the aforementioned range of the mixing ratio of raw materials and the flux in which a single garnet crystal is grown. Since the addition of $B_2O_3$ to the flux can lower the solidification temperature of the fused solution or flux by several tens degrees in centigrade, the lowest temperature of the flux allowing the crystal to be dipped up lowers by substantially the same degrees. As a result, if $B_2O_3$ is added as a component of the flux, a single crystal having a larger size and a larger amount of bismuth substitution can be obtained.

Figure 3A:
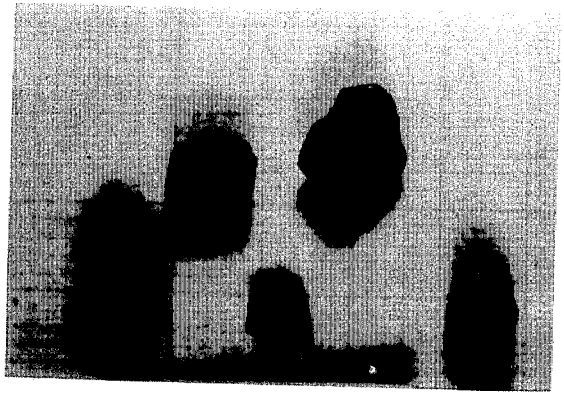
FIGS. 3A and 3B are photographs of Gd$_{3-x}$Bi$_x$Fe$_5$O$_{12}$ single crystals grown by the process in accordance with the present invention.
Figure 3B:

FIGS. 3A and 3B are photographs of single $Gd_{3-x}Bi_xFe_5O_{12}$ crystals grown respectively by the process in accordance with the present invention in which the grown single crystal is not extracted from the melting mixture (Example 7) and by the process in accordance with the present invention in which the grown single crystal is dipped up (Example 37). A glimpse of the photographs, particularly the faces of the grown crystals thus photographed, shows that the crystal grown by the latter method of the present invention has better quality than that grown by the former one.

FIG. 4 demonstrates the wave length dependency of Faraday rotation angle ($\theta_F$) for each one of single crystals of $Gd_{3-x}Bi_xFe_5O_{12}$ with respective bismuth substitution amounts (x) of 1.15 (Example 38), 1.05 (Example 36) and 0.7 (Example 35), and a single crystal of $Gd_3Fe_5O_{12}$ with a bismuth substitution amount (x) of zero. The sign of Faraday rotation angle ($\theta_F$) of the crystals containing bismuth (x≠0) is reversed to that of the crystal not containing bismuth (x=0) (see "The Faraday Effect of Bismuth Substituted Rare-Earth Iron Garnet" by H. Takeuchi, Japanese J. Appl. Phys., Vol. 14 (1975), p. 1903). The value of $\theta_F$ decreases as the wave length increases. The Faraday rotation angles ($\theta_F$) of the $Gd_3Fe_5O_{12}$ crystal and the $Gd_{3-x}Bi_xFe_5O_{12}$ crystals (x=0.7, 1.05 and 1.15) were about 300°/cm, 5,200°/cm, 7,800°/cm and 9,500°/cm, respectively, at a wavelength of 0.8 μm. It is to be noted that the value of $\theta_F$ for the crystal with bismuth substitution: x=1.15 was about 30 times larger than that for the crystal of $Gd_3Fe_5O_{12}$ without bismuth substitution: x=0. Further, an absorption coefficient of the crystal prepared according to the process of the present invention was about 100 cm$^{-1}$ at a wave length of 0.8 μm.

As is apparent from the foregoing explanation, the process of the present invention provides the following advantageous effects.

(1) Since the substitution amount of an impurity (for instance, bismuth in Examples given herein) strongly depends on the extracting temperature of a single crystal, a substitution amount of the impurity in the grown crystal can be controlled.

(2) Since a grown single crystal is extracted, for example, dipped up before the solidification of the flux, the crystal obtained is of high quality with little cracks.

(3) While in the conventional flux method, it is impossible to examine the state of a single crystal on its way of growth. By contrast, according to the process of the present invention, the state and manner of the growth of a single crystal can be examined at various temperatures by dipping up and checking the crystal at those temperatures. Thus, the optimum condition for the growth of a desired single crystal can easily be determined.

(4) As described hereinbefore, in the conventional flux method, a grown single crystal is obtained by overflowing the fused flux by slanting a crucible in a furnace before solidification of the flux, by washing to dissolve away the solidified flux with hydrochloric acid, nitric acid or the like over several days, or by crushing the solidified flux. On the other hand, the process of the present invention provides a single crystal of very high quality without the above-mentioned troublesome work accompanying the conventional flux method.

Further, the present invention is not only applicable to the oxide mentioned above, but also to the growth of other single oxide crystal, such as orthoferrite ($RFeO_3$, R:Y, La, Lu or rare earth element), orthoaluminate ($RAlO_3$, R:Y, La, Lu or rare earth element), orthochromite ($RCrO_3$, R:Y, La, Lu or rare earth element). As the flux, $V_2O_5$ may be also used.

Furthermore, the process of the present invention can provide a single crystal of gadolinium-iron garnet with a bismuth substitution amount (x) of 1 or more, so that a magneto-optic material having a very large Faraday rotation angle can be obtained.

What is claimed is:

1. A process for preparing a bismuth-substituted gadolinium-iron garnet bulk single crystal, comprising the steps of:
   (1) preparing a mixture of $Gd_2O_3$, $Fe_2O_3$ and $Bi_2O_3$ in the following mol% proportion:

$0 < Gd_2O_3 \leq 8$ $30 \leq Fe_2O_3 \leq 53$ $40 \leq Bi_2O_3 \leq 61$ where said $Gd_2O_3$ and said $Fe_2O_3$ constitute raw materials and said $Bi_2O_3$ is a flux and also a component of said raw materials;
   (2) melting said mixture;
   (3) cooling said mixture to precipitate and grow entirely from the material comprising said mixture a bulk single crystal of bismuth-substituted gadolinium-iron garnet, the remaining molten mixture surrounding said crystal including flux and raw material not incorporated into said crystal; and
   (4) extracting said bulk single crystal from said remaining molten mixture while said remaining mixture is still molten.

2. A process as claimed in claim 1, wherein said single crystal is extracted from said molten mixture by scooping said crystal from said remaining mixture.

3. A process as claimed in claim 1, wherein said single crystal is of bismuth-substituted gadolinium-iron garnet derived from a mixture of $Gd_2O_3$ in the range of 5–7 mol% and $Fe_2O_3$ in the range of 39–44 mol%.

4. A process as claimed in claim 2, wherein said single crystal is scooped from said remaining mixture at a temperature ranging from 1,050° C. to the solidification temperature of the fused mixture.

5. A process as claimed in claim 1, wherein said single crystal is scooped from said remaining mixture at a temperature ranging from 1,050° C. to the solidification temperature of the fused mixture.

6. A process as claimed in claim 3, wherein said single crystal is extracted from said molten mixture by scooping said crystal from said remaining mixture at a temperature ranging from 1,050° C. to the solidification temperature of the fused mixture.

7. A process as claimed in claim 1, wherein said flux further comprises up to 4.1 mol% of $B_2O_3$.

8. A process as claimed in claim 7, wherein said single crystal is of bismuth-substituted gadolinium-iron garnet derived from a mixture of $Gd_2O_3$ in the range of 5–7 mol%, $Fe_2O_3$ in the range of 39–44 mol% and $Bi_2O_3$ in the range of 50–56 mol%.

9. A process according as claimed in claim 1, wherein said mixture is cooled at a rate between 0.4° C. per hour and 12° C. per hour.

10. A process as claimed in claim 7, wherein said mixture is cooled at a rate between 0.4° C. per hour and 1° C. per hour.

11. A process as claimed in claim 7, wherein said single crystal is extracted from said molten mixture by scooping said crystal from said remaining mixture.

* * * * *